United States Patent [19]

Matsumoto et al.

[11] Patent Number: 5,142,235
[45] Date of Patent: Aug. 25, 1992

[54] TWO WIRE DETECTION SYSTEM FOR PRODUCING ABNORMAL STATE OUTPUTS

[75] Inventors: Akio Matsumoto; Yasushi Matsuoka, both of Takatsuki; Yoshimi Kanda, Nagaokakyo; Satoshi Motouji, Kyoto; Tsutomu Ajioka, Takatsuki, all of Japan

[73] Assignee: Omron Tateisi Electronics Co., Kyoto, Japan

[21] Appl. No.: 643,093

[22] Filed: Jan. 22, 1991

Related U.S. Application Data

[63] Continuation of Ser. No. 336,053, Apr. 11, 1989, abandoned.

[30] Foreign Application Priority Data

May 11, 1988 [JP] Japan ............................ 63-48569[U]
May 12, 1988 [JP] Japan ................... 63-89720

[51] Int. Cl.⁵ ............................................ G01R 31/02
[52] U.S. Cl. .................................. 324/537; 324/538; 324/555; 340/664
[58] Field of Search ............... 324/522, 538, 555, 556, 324/133, 236, 237, 682; 340/661, 664; 361/179, 181; 331/65; 307/116

[56] References Cited

U.S. PATENT DOCUMENTS

| | | | |
|---|---|---|---|
| 3,829,850 | 8/1974 | Guetorsloh | 361/181 X |
| 3,931,571 | 1/1976 | Hocking et al. | 324/236 |
| 4,068,189 | 1/1978 | Wilson | 324/236 X |
| 4,433,309 | 2/1984 | Hermle et al. | 324/236 X |
| 4,446,427 | 5/1984 | Lovrenich | 324/236 X |

FOREIGN PATENT DOCUMENTS

| | | |
|---|---|---|
| 0171013 | 2/1986 | European Pat. Off. |
| 2400723 | 7/1975 | Fed. Rep. of Germany |
| 2745650 | 4/1979 | Fed. Rep. of Germany |
| 3527619 | 8/1986 | Fed. Rep. of Germany |

*Primary Examiner*—Jack B. Harvey
*Attorney, Agent, or Firm*—Dickstein, Shapiro & Morin

[57] ABSTRACT

The detection system comprises a sensor and a controller which are connected by two wires. The sensor can take more than two states as opposed to conventional detection systems. According to this arrangement, for instance, a small leakage current exists even when the sensor is in normal off state, and, therefore, electric current in the range of I1 to I2 flows even in normal off state. On the other hand, electric current of I3 to I4 flows in normal on state. When there is a wire breakage, no electric current flows. Conversely, when there is a shortcircuiting, electric current exceeding I4 flows. Electric current in the range of I3 to I4 corresponds to an unstable state which is neither normal on state nor normal off state. Thus, by distinguishing the level of the electric current flowing through the wires, by using suitable electric current level detecting circuit, which of the level classes it belongs to, a state signal corresponding to the result of this distinguishing process can be outputted for self-diagnosing purpose.

9 Claims, 4 Drawing Sheets

TWO WIRE DETECTION SYSTEM FOR PRODUCING ABNORMAL STATE OUTPUTS

This application is a continuation of application Ser. No. 336,053, filed Apr. 11, 1989, now abandoned.

TECHNICAL FIELD

The present invention relates to two-wire detection systems such as two-wire proximity sensors which are connected to a controller by a pair or wires, and in particular to such detection systems having means for producing signals relating to the states of the detection systems themselves in addition to their normal output signals.

BACKGROUND OF THE INVENTION

Lately, two-wire type sensors using only two wires both as power lines and as signal lines are widely used. According to a detection system consisting of such a two-wire sensor and a controller which are connected to each other by two wires, the sensor supplies an on/-off signal, and the controller distinguishes the on/off state of the signal according to a certain threshold level.

According to such conventional two-wire type detection systems, since the controller detects the on/off state of the signal according to a certain threshold level, it cannot distinguish an abnormal off state signal which may be due to wire breakage or wire disconnection from a normal off state signal, and, when a shortcircuiting has occurred in the sensor, the controller receives what appears to be an on state signal and, again, cannot distinguish it from a normal on state signal.

One of the most important applications of this technology is found in proximity switches which are typically used in an extremely large number in modern manufacturing plants in conjunction with the use of programmable controllers. In such applications, owing to such advantages as a reduced amount of wiring, the possibility of serial connection to a programmable controller, and the elimination of dedicated power lines for the proximity switches, two-wire type DC proximity switches have been preferred. Such a conventionally known two-wire type proximity switch comprises an oscillation circuit including a detection coil and a resonance capacitor, an integration circuit for integrating the output from the oscillation circuit, a comparator circuit comparing the output from the integration circuit with a reference level, and an output circuit for responding to the output from the comparator circuit, and the two power lines leading to these circuits are also used as signal lines.

Generally, when a proximity switch is used in combination with other sensors and controllers as a part of a large system, various component parts thereof including the proximity switch are required to be highly reliable, and, as a part of such a consideration, each component is desired to be provided with a self diagnosis function. In particular, in proximity switches using detection coils, it is highly desirable to have an output for indicating the occurrence of any breakage in the detection coils. However, according to conventional two-wire type proximity switches, the output consists of only two possible states to indicate the states of on and off, and it has been impossible to obtain a signal output indicating the occurrence of breakage of a coil wire.

BRIEF SUMMARY OF THE INVENTION

In view of such problems of the prior art, a primary object of the present invention is to provide a detection system, using only two wires between its sensor and controller, which can supply a signal related to a state of the sensor in addition to its normal sensor signals.

A second object of the present invention is to provide a two-wire type detection system which is provided with the function of indicating a state of the sensor without any substantial alteration to the system.

A third object of the present invention is to provide a two-wire type detection system which can detect not only a wire disconnection in its sensor but also any shortcircuiting in the sensor.

These and other objects of the present invention can be accomplished by providing a two-wire detection system consisting of a sensor and a controller which are connected to each other by two wires, comprising: variable resistance means included in the sensor to achieve in the wires a first current level when a first state is detected and a second current level when a second state is detected; current detecting means included in the controller to detect the first current level, the second current level, and a third current level which is equal to neither the first current level nor the second current level; output means included in the controller to produce a first output signal when the first current level is detected by the current detecting means and a second output signal when the second current level is detected by the current detecting means; and abnormal state detecting means for producing an abnormal output when the third current level is detected by the current detecting means.

Thus, by detecting the third current level, it is possible to detect an abnormal state of the sensor. The abnormal current level may be lower than the normal current levels or higher. In some cases, when the sensor has two levels of normal output, a current level intermediate between these two normal current levels may be assigned as an abnormal unstable output level.

According to a preferred embodiment of the present invention applied to a proximity detection system, the sensor consists of a proximity switch comprising an oscillation circuit including a detection coil and a resonance capacitor, an integration circuit for integrating an output from the oscillation circuit, a comparator circuit for comparing an output from the integration circuit with a reference level, and an output circuit for responding to an output from the comparator circuit, and leakage current supply means for achieving a leakage current level corresponding to the third current level in the two wires by detecting the presence of electric current conducted through the detection coil, the two wires serving both as power supply lines and as signal lines. Thus, with a small modification to a conventional proximity detection system, it is possible to improved reliability by providing means for detecting a certain abnormal state of the proximity sensor.

BRIEF DESCRIPTION OF THE DRAWINGS

Now the present invention is described in the following with reference to the appended drawings, in which.

DETAILED DESCRIPTION OF THE PREFERRED EMBODIMENTS

The working principle of this invention is described in the following in terms of an embodiment in the form of a proximity detection system with reference to FIG. 2.

According to this two-wire proximity detection system, the sensor can take more than two states as opposed to conventional proximity detection systems. According to this arrangement, a small leakage current exists even when the sensor is in normal off state, and, therefore, electric current in the range of I1 to I2 flows even in normal off state. On the other hand, electric current of I3 to I4 flows in normal on state. When there is a wire breakage, no electric current flows. Conversely, when there is a shortcircuiting, electric current exceeding I4 flows. Electric current in the range of I3 to I4 corresponds to an unstable state which is neither normal on state nor normal off state. Thus, by distinguishing the level of the electric current flowing through the wires, by suitable electric current level detecting means, which of the level classes it belongs to, a state signal corresponding to the result of this distinguishing process can be outputted.

Figure 4:
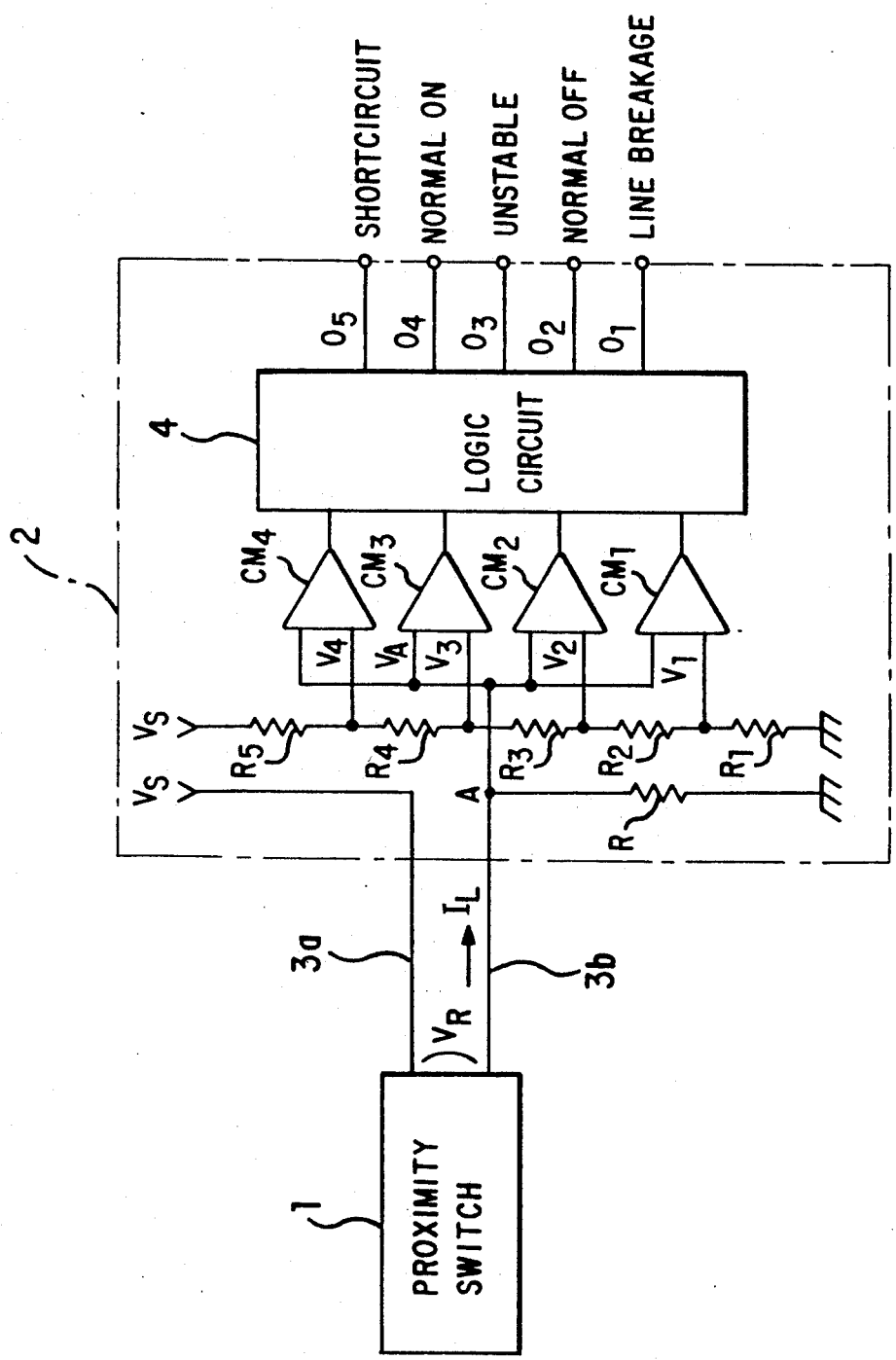
FIG. 4 is a circuit diagram of a controller for the sensor given in FIG. 3.

FIG. 4 is a circuit diagram of a two-wire detection system constructed as an embodiment of the present invention. In this drawing, a two-wire type proximity switch 1 is connected to a controller 2 via a pair of wires 3a and 3b. The wire 3a is connected to a power source Vs of the controller 2 while the wire 3b is connected to ground via a resistor R in the controller 2 on the one hand and to one of the input ends of each of a plurality of comparators CM1, CM2, CM3 and CM4 on the other hand. When electric current of amplitude $I_L$ is conducted through these wires 3a and 3b, the electric current is conducted through the resistor R also and a voltage $V_A$ ($=I_L R$) corresponding to this electric current is obtained at node A. In other words, the electric current $I_L$ is converted into the voltage $V_A$. Further, the voltage Vs from the power source is divided by resistors R1, R2, R3, R4 and R5, and the corresponding voltages V1, V2, V3 and V4 are applied to the other input ends of the comparators CM1, CM2, CM3 and CM4.

The comparator CM1 produces a high signal when $V1 < V_A$, and the remaining comparators CM2, CM3 and CM4 likewise produce high signals when $V2 < V_A$, $V3 < V_A$, and $V4 < V_A$, respectively. The voltages V1, V2, V3 and V4 correspond to the electric current I1, I2, I3 and I4 shown in FIG. 2. The outputs of these comparators CM1, CM2, CM3 and CM4 are supplied to a logic circuit 4 which, in turn, produces a wire breakage abnormal state signal O1, a normal off state signal O2, an unstable state signal O3, a normal on state signal O4 and a shortcircuit abnormal state signal O5 according to the logic state of the signal supplied thereto as described hereinafter.

Suppose there was a wire breakage in the wire 3a or 3b of the proximity switch 1, the voltage $V_A$ would then be zero since no electric current is conducted through the resistor R from the wires 3a and 3b. Therefore, $V_A$ is less than V1 and the output levels of the comparators CM1, CM2, CM3 and CM4 are all low, so that the logic circuit 4 receiving this low level signal produces the wire breakage abnormal state signal O1.

When the detected state of the proximity switch 1 is normal off state, since the electric current $I_L$ is located between I1 and I2 and the voltage $V_A$ at point A is therefore higher than V1 but lower than V2, only the comparator CM1 produces a high level output signal whereas all the other comparators CM2, CM3 and CM4 produce low level signals so that the logic circuit 4 accordingly produces the normal off state signal O2.

When the detected state of the proximity switch 1 is normal on state, since the electric current $I_L$ flowing through the wires 3a and 3b is located between I3 and I4 and the voltage $V_A$ at point A is therefore higher than V3 but lower than V4, only the comparator CM4 produces a low level output signal whereas all the other comparators CM1, CM2 and CM3 produce high level signals so that the logic circuit 4 accordingly produces the normal on state signal O4.

Figure 2:
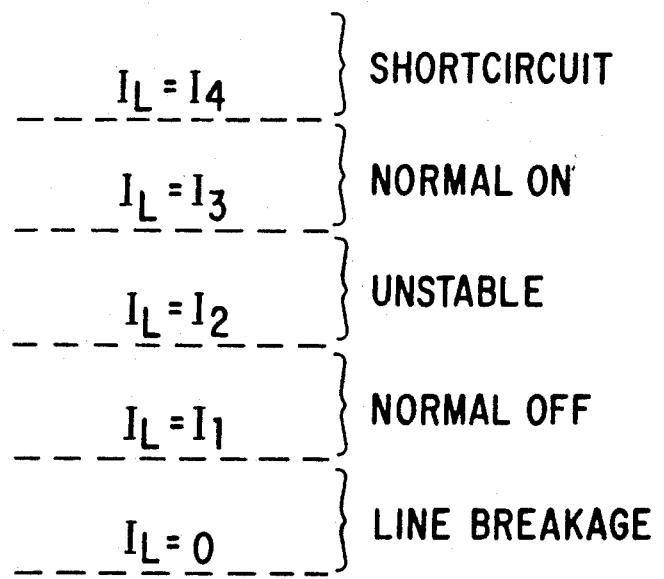
FIG. 2 is a diagram illustrating the working principle of the embodiment given in FIG. 1.

Suppose there was a shortcircuiting in the wires 3a and 3b of the proximity switch 1, a shortcircuit current would then flow from the power source Vs through the proximity switch 1 and the resistor R, and this electric current is larger than I4 shown in FIG. 2. Therefore, the voltage $V_A$ is higher than V4 and the output levels of the comparators CM1, CM2, CM3 and CM4 are all high. As a result, the logic circuit 4 produces the shortcircuit abnormal state signal O5.

When the proximity switch 1 is in an unstable state which is neither the normal off state nor the normal on state, since the electric current $I_L$ flowing through the wires 3a and 3b is located between I2 and I3 and the voltage $V_A$ at point A is therefore higher than V2 but lower than V3. The comparators CM1 and CM2 will then produce high level output signals while the other comparators CM3 and CM4 will produce low level signals so that the logic circuit 4 accordingly produces the unstable state signal O3.

Although the resistors R1, R2, R3, R4 and R5, the comparators CM1 through CM4, and the logic circuit 4 were used to detect the electric current conducted through the two wires and to distinguish the level of the conducted electric current in the above described embodiment, the level of the electric current may also be distinguished by other means beside this specific circuit.

Further, the above embodiment pertained to an example of a proximity sensor as a two-wire type sensor, but the two-wire type sensor is in no way limited to such proximity switches but may equally be other sensors such as pressure sensors, temperature sensors, photoelectric sensors, etc..

According to this invention, since abnormal state signals such as the wire breakage abnormal state signal, the shortcircuit abnormal state signal and the unstable state signal can be obtained in addition to the normal on state signal and the normal off state signal using only the two-wires to connect sensor with the controller, a highly reliable two-wire type detection system can be produced.

Figure 3:
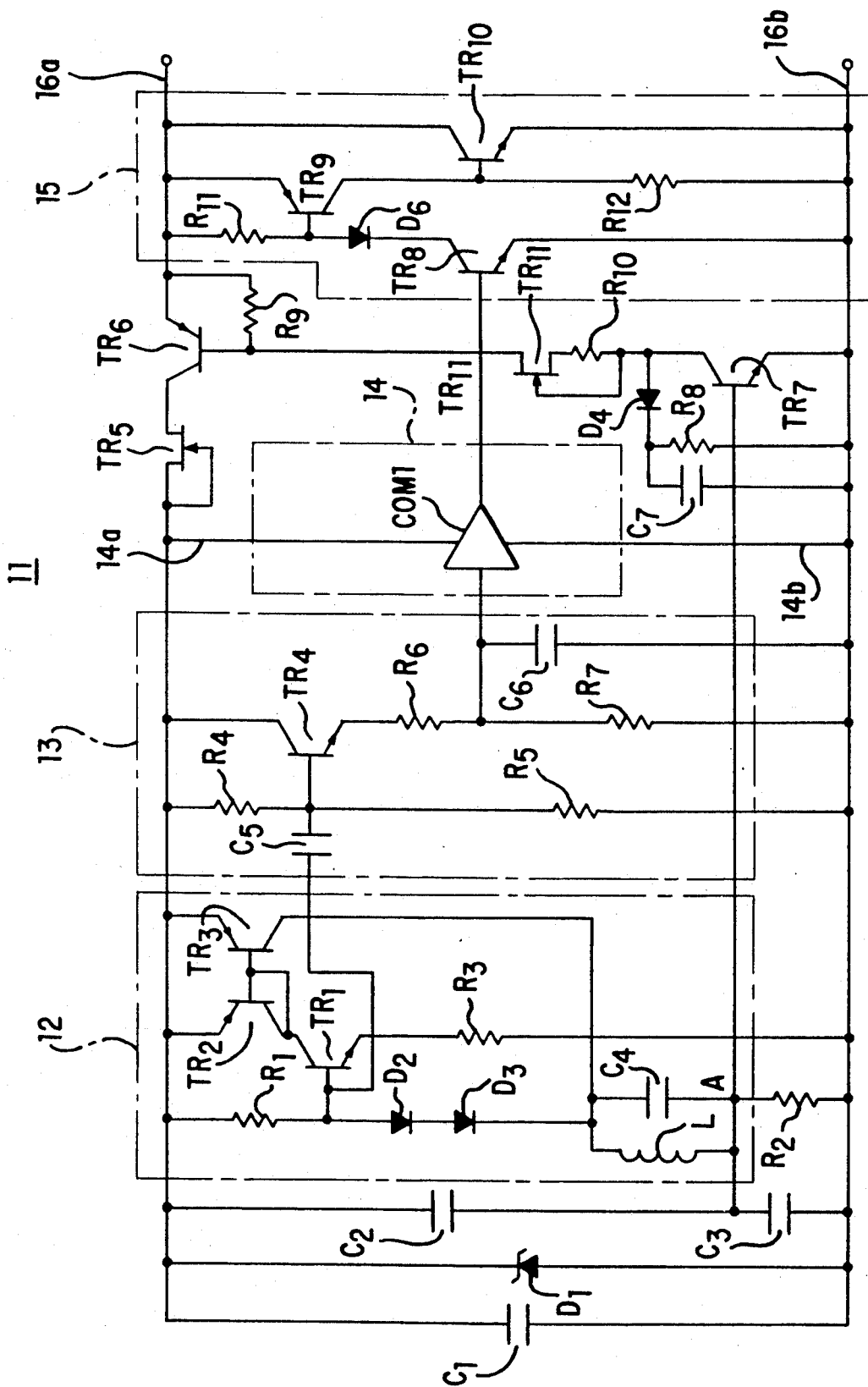
FIG. 3 is a circuit diagram of a sensor of a second embodiment of the detection system according to this invention.

FIG. 3 is a circuit diagram of a two-wire type proximity switch constructed according to this invention. In this drawing, the proximity switch 11 comprises an oscillation circuit 12 including a detection coil L and an resonance capacitor C4, an integration circuit 13 for integrating the oscillation output of the oscillation circuit 12, a comparator circuit 14 for comparing the output of the integration circuit 13 with a threshold level (reference voltage) 14a, 14b, and an output circuit 15 which turns on and off according to the output from the comparator, circuit 14. Electric current is supplied from a controller (not shown in the drawings) to these circuits via a pair of power supply lines 16a and 16b which also transmit the state of the output circuit 15 to the controller. The above-described basic structure is similar to those of conventional two-wire type proximity switches.

Further, in this proximity switch of this embodiment, transistors TR6 and TR5 are connected in series with the power supply line 16a, and electric current is supplied to the main circuits such as the oscillation circuit 12, the integration circuit 13 and the comparator circuit 14 via these transistors TR6 and TR5. The transistor TR6 is a PNP type transistor having an emitter connected to the load, and a resistor R9 is connected across its emitter and base. Between the base of the transistor TR6 and the power supply line 16b is connected a serial circuit consisting of a transistor TR11, a resistor R10 and a transistor TR7. The transistor TR7 is an NPN transistor having a collector connected to the resistor R10 and an emitter connected to the power supply line 16b. The collector of the transistor TR7 is connected to the anode of a diode D4, and between the cathode of this diode and the power supply line 16b is connected a parallel circuit consisting of a resistor R8 and a capacitor C7.

Between the node A between the detection circuit L and the resonance capacitor C4 of the oscillation circuit 12 and the power supply line 16b is connected a resistor R2, and the node A is connected to the base of the transistor TR7.

Now the operation of this two-wire type proximity switch of this embodiment is described in the following.

When the controller is connected to the power supply lines 16a and 16b and electric power is thereby supplied to the proximity switch, a voltage is applied to the transistor TR11 via the emitter-base junction of the transistor TR6 and the resistor R9, and a constant current circuit consisting of the transistor TR11 and the resistor R10 is thereby activated. The constant electric current therefrom is supplied to the capacitor C7 via the diode D4, and starts electrically charging the capacitor C7. Therefore, electric current of hfe (the current gain of the transistor TR6) times the constant electric current from the transistor TR7 and the resistor R10 flows through the emitter and collector of the transistor TR6. As a result, the constant electric current circuit of the transistor TR5 is activated, and the power source voltage of the main circuit rises to the zener voltage of the zener diode D1.

Upon application of the power source voltage, the oscillation circuit 12 starts its oscillation action. The oscillation output therefrom is integrated by the integration circuit 13, and its output is supplied to the comparator circuit 14. As long as nothing is being detected, the oscillation amplitude is large and the input voltage is higher than the threshold level so that the low level output of the comparator circuit 14 turns off the transistors TR8, TR9 and TR10. Therefore, only the leakage current from the main circuit flows through the proximity switch 11, and this leakage current is supplied to the controller as the normal off state output via the two-wire lines.

When an object is detected, the oscillation output of the oscillation circuit 12 drops and the input voltage to the comparator circuit 14 drops below the threshold level. Therefore, the output level of the comparator circuit 14 goes high and turns on the output circuit 15 and the transistors TR8, TR9 and TR10.

As described above, the oscillation output changes depending on the presence of an object. In any event, as long as the detection coil L is without any wire breakage and the oscillation circuit is functioning properly, electric current flows through the resistor R7 and the voltage of the node A becomes higher than the voltage level of the power supply line 16b with the result that the transistor TR7 become conductive. Even when the capacitor C7 is fully charged after turning on the power, since the transistor TR7 is conductive, the transistors TR11 and the resistor R10 delivers its constant current through the transistor TR7. Therefore, the conductive state of the transistor TR6 is maintained.

When there is a wire breakage in the detection coil L, since no electric current flows through the resistor R2, the voltage level of the node A drops and the turns off the transistor TR7. Since the value of the resistor R8 is selected to be sufficiently large, the capacitor C7 is kept charged and the constant electric current circuit consisting of the transistor TR11 and the resistor R10 remains inactive. Therefore, the transistor TR6 is nonconductive, the constant voltage of the main circuit drops, the output circuit 15 turns off, and the leakage current drops to zero. In this case, the electric current flowing through the two-wire lines and the controller is different from that in the case of the normal off state, and the leakage current is substantially reduced to zero.

Figure 1:
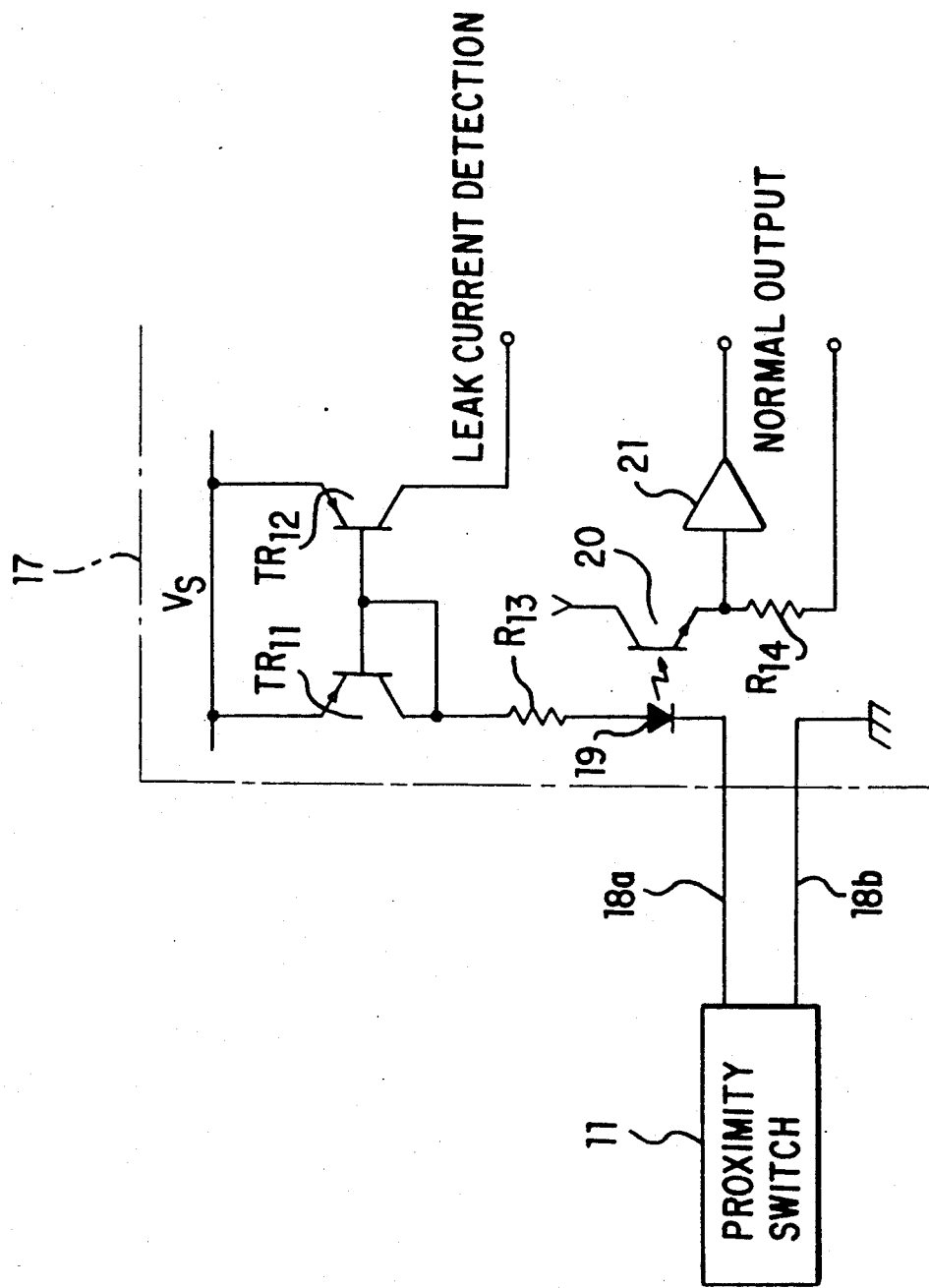
FIG. 1 is a circuit diagram of a controller of a first embodiment of the detection system according to the present invention.

Now an example of the process of detecting a coil wire breakage from the controller based on the zero leak current detection is described in the following with reference to FIG. 1. The proximity switch 11 and the controller 17 are connected via two-wire lines 18a and 18b. The two-wire lines 18a and 18b are connected to power supply lines 16a and 16b in the proximity switch 11. In the controller 17, the line 18b is grounded and the line 18a is connected to the power source Vs via an LED 19 of a photocoupler, a resistor R13 and a transistor TR11 of a current mirror circuit. The leakage current is detected from the transistor TR12 of the other half of the current mirror circuit. The normal on/off state signals are transmitted to a phototransistor 20 and an amplifier 21 in response to the lighting and unlighting of the LED 19. In the normal off state of the proximity switch 11, because of the presence of the leakage current, the leakage current flows through the transistor TR11 and electric current of the same amplitude flows through the transistor TR12. However, when a coil wire breakage occurs in the detection coil L, no electric current is conducted through the transistors TR11 and TR12, and the occurrence of the coil wire breakage can be detected.

In short, according to this two-wire type proximity switch, under normal operating condition or when there is no breakage in the detection coil, electric current flows through the resistor connected in series with the detection coil and the resonance capacitor. Therefore, the node between the detection coil and the resistor is kept at a certain voltage level, and the transistor TR7 is therefore in conductive state. That the second transistor TR7 is in conductive state causes the transistor TR6 to be in conductive state and, even though the output circuit is in the off state, leakage current flows through the power supply lines to the main circuit unit. On the other hand, when a coil wire breakage occurs, no current flows through the resistor which is connected in series with the detection coil and the voltage of the node becomes lower than a prescribed voltage level with the result that the transistor TR7 becomes non-conductive, and, in response to this, the transistor TR6 also becomes non-conductive. It follows then that no leakage current is supplied to the main circuit unit, and the electric current flowing through the power supply lines drop to a substantially zero level. Therefore, by detecting the electric current flowing through the power supply lines, it is possible to distinguish between the normal off state and the breakage of the detection coil.

Thus, according to this invention, since there are provided a first transistor TR6 connected in series with the power supply line; a resistor R2 connected between a node between the detection coil L and the resonance capacitor C4 and one of the power supply lines; and a second transistor TR7 for on/off controlling the first transistor TR6 by being on/off controlled by a voltage produced across the resistor R2, in the event of occurrence of a coil wire breakage in the detection coil, the electric current flowing through the first transistor TR6 or the leakage current is reduced to zero. Therefore, a distinction can be made from the normal off state in the case of which some leakage current exists and the occurrence of the coil wire breakage can be detected without increasing the number of the wires.

What we claim is:

1. A two-wire detection system comprising:
   a sensor, said sensor including:
      impedance means to achieve in two wires a first current level when a first state is detected by said sensor and a second current level when a second state is detected by said sensor; and
      a comparator circuit for comparing said current levels with a reference level provided by said two wires; and
   a controller connected to said sensor by said two wires, said controller including;
      current comparators for comparing said first current level to a first threshold level, for comparing said second current level to a second threshold level, and for comparing a third current level which is not equal to said first current level or said second current level to a third threshold level;
      a controller output means for producing a first output signal when said first current level is detected by said current comparators and a second output signal when said second current level is detected by said current comparators; and
      an abnormal circuit state detector for producing an abnormal output when said third current level is detected by said current comparators.

2. A two-wire type detection system according to claim 1, wherein said sensor further comprises;
   a proximity switch comprising an oscillation circuit including a detection coil and a resonance capacitor;
   an integration circuit for integrating an output from said oscillation circuit;
   an output circuit for responding to an output from said comparator circuit; and
   a leakage current supply for achieving a leakage current level corresponding to said third current level in said two wires by detecting the presence of electric current conducted through said detection coil, said two wires serving both as power supply lines and as signal lines.

3. A two-wire type detection system according to claim 1, wherein said third current level is lower than said first current level, and said first current level is lower than said second current level, said current comparators being further adapted to detect a fourth current level which is higher than said second current level, and said abnormal circuit state detector producing an abnormal output when said fourth current level is detected.

4. A two-wire type detection system according to claim 3, wherein said fourth current level represents a short-circuit state.

5. A two-wire type detection system according to claim 1, wherein said current comparators are further adapted to detect a fifth current level which is intermediate between said first current level and said second current level, and said abnormal circuit state detector producing an abnormal output when said fifth current level is detected.

6. A two-wire type detection system according to claim 5, wherein said fifth current level represents an unstable circuit state.

7. A two-wire type detection system according to claim 1, wherein said first, second and third threshold levels are provided through serial resistors connected to a voltage source wherein each resistor divides a voltage from said voltage source.

8. A two-wire type detection system according to claim 1, wherein said impedance means varies resistance through an inductor wherein an object located proximate to said sensor will cause said sensor to have an increased resistance effect when said proximate object absorbs energy from a magnetic field created by said inductor.

9. A two-wire type detection system according to claim 1, wherein said first current level represents a normal OFF state, said second current level represents an ON state, and said third current level represents a line breakage state.

* * * * *